United States Patent
Chen et al.

(10) Patent No.: US 11,962,339 B2
(45) Date of Patent: Apr. 16, 2024

(54) METHOD AND APPARATUS FOR REDUCED SIZE RF FILTER

(71) Applicant: Samsung Electronics Co., Ltd., Suwon-si (KR)

(72) Inventors: Michael Chen, Dallas, TX (US); Khurram Muhammad, Southlake, TX (US); Xinguang Xu, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 529 days.

(21) Appl. No.: 17/139,947

(22) Filed: Dec. 31, 2020

(65) Prior Publication Data

US 2022/0069856 A1 Mar. 3, 2022

Related U.S. Application Data

(60) Provisional application No. 63/069,874, filed on Aug. 25, 2020.

(51) Int. Cl.
*H04B 1/12* (2006.01)
*H03H 17/00* (2006.01)
(Continued)

(52) U.S. Cl.
CPC ......... *H04B 1/123* (2013.01); *H03H 17/0054* (2013.01); *H03H 17/02* (2013.01);
(Continued)

(58) Field of Classification Search
CPC .......... H04B 1/10; H04B 1/1036; H04B 1/12; H04B 1/123; H04B 2001/1063;
(Continued)

(56) References Cited

U.S. PATENT DOCUMENTS

| 5,446,421 A | 8/1995 | Kechkaylo |
| 6,539,202 B1 | 3/2003 | Yamashita et al. |

(Continued)

FOREIGN PATENT DOCUMENTS

| KR | 10-2006-0012529 A | 2/2006 |
| KR | 10-0830695 B1 | 5/2008 |

OTHER PUBLICATIONS

K. E. Kolodziej, et al., "Multitap RF Canceller for In-Band Full-Duplex Wireless Communications," IEEE Transactions on Wireless Communications, vol. 15, No. 6, pp. 4321-4334, Jun. 2016.
MCV Microwave, DHPM1880-1960-60A1, LTE Band-2 Ceramic Duplexer, Rev 3—Original Revision Date: Oct. 10, 2014—Revision Date: Aug. 6, 2015, 3 pgs.

(Continued)

*Primary Examiner* — Quochien B Vuong

(57) ABSTRACT

A radio frequency (RF) unit and a method for RF isolation. The RF unit includes first and second RF couplers, an RF filter, and an RF canceler connected in parallel with the RF filter. The first RF coupler is configured to receive an input signal. The RF filter is configured to receive a first portion of the input signal from the first RF coupler and attenuate frequencies outside of a passband of the RF filter from the first portion of the input signal. The RF canceler is configured to receive a second portion of the input signal from the first RF coupler and generate a cancellation signal from the second portion of the input signal based on a target frequency band of the RF canceler. The second RF coupler is configured to combine the cancellation signal with an output of the RF filter to generate an output signal.

17 Claims, 8 Drawing Sheets

(51) Int. Cl.
    *H03H 17/02*   (2006.01)
    *H03H 17/08*   (2006.01)
    *H04B 7/0413*  (2017.01)

(52) U.S. Cl.
    CPC ..... *H03H 17/08* (2013.01); *H03H 2017/0081* (2013.01); *H04B 7/0413* (2013.01)

(58) Field of Classification Search
    CPC ... H04B 1/38; H04B 1/40; H04B 1/50; H04B 1/52; H04B 1/525; H04B 1/54; H04B 1/56; H04B 1/58; H03H 17/0054; H03H 17/02; H03H 17/08
    See application file for complete search history.

(56)            References Cited

U.S. PATENT DOCUMENTS 6,959,056 B2 * 10/2005  Yeap ............... H04B 1/1036
                                                     375/346
    8,078,130 B2 * 12/2011  Fudge .............. H04B 1/1036
                                                     455/295
    9,887,728 B2 *  2/2018  Jain .................... H04B 1/18
    10,714,828 B2   7/2020  Parker et al.
    10,804,943 B2 * 10/2020 Hahn ................... H04B 1/40

OTHER PUBLICATIONS

International Search Report of the International Searching Authority dated Nov. 24, 2021, in connection with International Application No. PCT/KR2021/011053, 3 pages.

* cited by examiner

METHOD AND APPARATUS FOR REDUCED SIZE RF FILTER

CROSS-REFERENCE TO RELATED APPLICATION(S) AND CLAIM OF PRIORITY

This application claims priority under 35 U.S.C. § 119(e) to U.S. Provisional Patent Application No. 63/069,874 filed on Aug. 25, 2020. The above-identified provisional patent application is hereby incorporated by reference in its entirety.

TECHNICAL FIELD

This disclosure relates generally to filtering in radio antenna systems. More specifically, this disclosure relates to active radio frequency (RF) cancellation to reduce the size of an RF filter.

BACKGROUND

In frequency division duplex (FDD) communication, two separate frequency bands, or channels, are assigned for the simultaneous downlink (DL) and uplink (UL) communications, and the transmitter and receiver are operated simultaneously through a shared antenna. Although FDD has the benefits of greater coverage due to accommodating higher transmission power, higher frequency resource efficiency with no guard time allocated, and potentially lower latency due to continuous transmission and reception, high isolation is required between the transmitter (TX) and the receiver (RX) to mitigate interference between UL and DL bands.

Typically, TX-RX isolation is provided by a duplexer in FDD base stations. The transmitter in an FDD base station transmits at a power level high enough that leakage of the TX signal into the nearby RX band can desensitize the receiver. In some cases, 96 dB of TX-RX isolation can be required to reduce the TX leakage below the RX noise floor, thereby preventing desensitization of the receiver. A duplexer built using a cavity filter, for example, to provide such a level of isolation requires many filter stages. As a result, the duplexer will be large, heavy, and expensive. In a massive multiple-input multiple-output (MIMO) base station, where such TX-RX isolation might be needed, the use of such a duplexer will make the base station bulky and expensive.

SUMMARY

Embodiments of the present disclosure provide a radio frequency (RF) unit. The RF unit includes first and second RF couplers, an RF filter, and an RF canceler connected in parallel with the RF filter. The first RF coupler is configured to receive an input signal. The RF filter is configured to receive a first portion of the input signal from the first RF coupler and attenuate frequencies outside of a passband of the RF filter from the first portion of the input signal. The RF canceler is configured to receive a second portion of the input signal from the first RF coupler and generate a cancellation signal from the second portion of the input signal based on a target frequency band of the RF canceler. The second RF coupler is configured to combine the cancellation signal with an output of the RF filter to generate an output signal.

In one embodiment, a method for RF isolation is provided. The method includes receiving, at a first RF coupler, an input signal. The method further includes receiving, at an RF filter, a first portion of the input signal from the first RF coupler, and attenuating, by the RF filter, frequencies outside of a passband of the RF filter from the first portion of the input signal. The method also includes receiving, at an RF canceler connected in parallel with the RF filter, a second portion of the input signal from the first RF coupler, and generating, by the RF canceler, a cancellation signal from the second portion of the input signal based on a target frequency band of the RF canceler. The method further includes combining, by a second RF coupler, the cancellation signal with an output of the RF filter to generate an output signal.

In another embodiment, a communication entity is provided. The communication entity includes at least one antenna configured to transmit and receive signals, and at least one radio frequency (RF) unit operably connected to the at least one antenna and configured to cancel interference in at least one of the signals received or to be transmitted. The RF unit includes first and second RF couplers, an RF filter, and an RF canceler connected in parallel with the RF filter. The first RF coupler is configured to receive an input signal. The RF filter is configured to receive a first portion of the input signal from the first RF coupler and attenuate frequencies outside of a passband of the RF filter from the first portion of the input signal. The RF canceler is configured to receive a second portion of the input signal from the first RF coupler and generate a cancellation signal from the second portion of the input signal based on a target frequency band of the RF canceler. The second RF coupler is configured to combine the cancellation signal with an output of the RF filter to generate an output signal.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
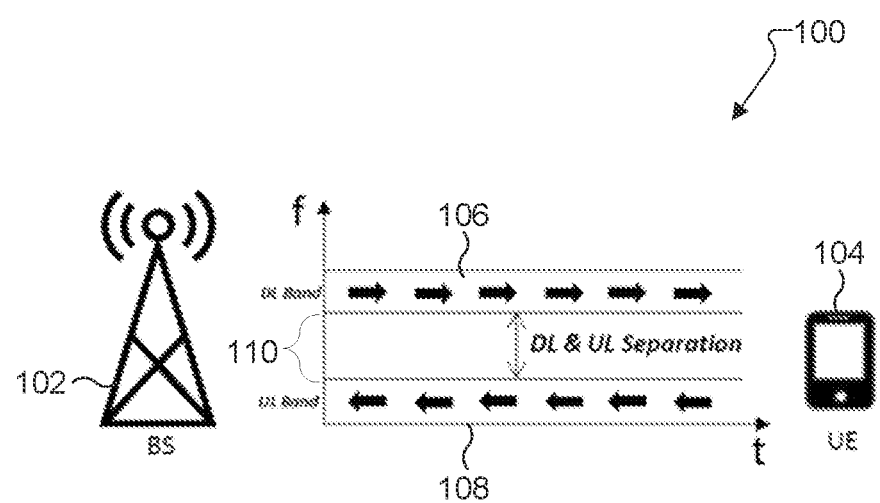
FIG. 1 illustrates an exemplary wireless system, which transmits messages according to the principles of the present disclosure.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Embodiments of the present disclosure recognize that even though a large separation band (typically tens or even hundreds of MHz) can be assigned between the UL and DL bands in an FDD system, there are still challenges for a FDD duplexer. In particular, transmitter (TX) leakage into the receiver (RX) band occurs due to power amplifier (PA) non-linearity that causes adjacent channel leakage, and due to antenna coupling. If the TX leakage in the RX band cannot be reduced to lower than the RX noise floor at the RX chain input, the TX leakage will degrade the receiver sensitivity.

Second, the TX noise floor is also much higher than the RX noise floor due to the high noise figure of the DAC in the TX chain and the high gain of the TX chain from DAC output to PA output. If the TX noise floor cannot be compressed to lower than the RX noise floor at the RX chain input, it will also degrade the UL receiver sensitivity, which further decreases the coverage.

Embodiments of the present disclosure recognize that, to address the above issues, a duplexer with isolation is implemented in FDD wireless communication devices to mitigate interference between the UL and DL bands. The TX leakage (which is comprised of TX signal and noise leakage) can be decreased to lower than the RX noise floor by high isolation in the duplexer, the UL receiver's sensitivity is thereby guaranteed, and the duplexer can be designed not to impact the TX power transmission. However, the isolation demands to achieve this goal can be extremely high. For example, in an FDD BS, more than 100 dB of isolation may be demanded of the duplexer due to the very large gap between the high transmission power for the DL TX band and the low sensitivity level for the UL RX band. Duplexers are typically made with mechanical cavity filters, and achieving this level of isolation requires many cavity filter stages, resulting in a high cost and large form factor.

Accordingly, embodiments of the present disclosure provide an active radio frequency (RF) cancellation system in the analog domain to provide active RF cancellation in conjunction with an RF filter (such as a cavity filter), achieving high system TX-RX isolation and large TX power handling at a lower cost and smaller form factor than a traditional duplexer with the same TX-RX isolation. In these embodiments, the active RF cancellation system and RF filter can replace the duplexer, or can be used in conjunction with the duplexer. The active RF cancellation system provides effective TX-RX isolation through active RF cancellation, which adds to the TX-RX isolation provided by the RF filter. That is, the active RF cancellation system relieves the isolation burden on the RF filter, thereby allowing the use of smaller, less costly RF filters while achieving the same total TX-RX isolation as a larger, more costly RF filter or duplexer.

Embodiments of the present disclosure provide the active RF cancellation system by sampling a signal at its input to an RF filter, matching the amplitude of the sampled signal within a target frequency band with the amplitude of the output signal from the RF filter, inverting the phase of the sampled signal within the target frequency band, and summing the resulting signal with the output from the RF filter to cancel effects of TX leakage (which is comprised of TX signal and noise leakage) that are induced in the RX band by the TX signal. These unwanted components can also be referred to as out-of-band leakage. This process can be performed either on the TX signal before transmission, or on the RX signal after reception.

Embodiments of the present disclosure recognize that the active RF cancellation process can be implemented using an analog finite impulse response (FIR) filter. The FIR filter can have fixed filter parameters (i.e., gain/attenuation, phase shift, delay) that result in a static target frequency band, or it can be adaptive, having tunable parameters that allow for the FIR filter to be reprogrammed in situ to adjust the target frequency band. For example, the parameters of the FIR filter could be adjusted based on feedback from the RX signal to further reduce the power of unwanted out-of-band leakage components.

Embodiments of the present disclosure also recognize that the disclosed active RF cancellation solution can be used in communication entities that include any full duplex transceiver, not only FDD transceivers. For example, the active RF cancellation solution can be used in cross division duplex (XDD) systems as an alternative isolation solution. XDD enhances the UL coverage of TDD carriers without sacrificing DL data throughput. The main idea is to allow the UE to transmit the uplink signal while the BS transmits the downlink signal at the same time in the same spectrum (similar to FDD) within the same TDD band. The UE's uplink can be scheduled with more opportunities in both time and frequency domain, therefore the coverage can be extended compared to TDD systems.

Embodiments of the present disclosure also recognize that the disclosed active RF cancellation system can be used for other purposes in addition to canceling out-of-band leakage in full duplex transceivers. For example, the active RF cancellation system can be used to cancel signals in part of an output band of a signal to comply with requirements or regulations on out of band emissions.

FIG. 1 illustrates an exemplary wireless system 100, which transmits messages according to the principles of the present disclosure. In the illustrated embodiment, wireless system 100 includes a transmission point (e.g., an Evolved Node B (eNB), Node B), such as base station (BS) 102. BS 102 may be in communication with other base stations and with the Internet or a similar IP-based system (not shown).

BS 102 provides wireless broadband access to the Internet to a user equipment (UE) 104 (e.g., mobile phone, mobile station, or subscriber station) within a coverage area of base station 102. UE 104 may access voice, data, video, video conferencing, and/or other broadband services via the Internet. UE 104 may be associated with an access point (AP) of a WiFi WLAN. UE 104 may be any of a number of mobile devices, including a wireless-enabled laptop computer, wireless-enabled personal computer, personal data assistant, notebook, handheld device, or other wireless-enabled device. While only one base station and one user equipment are depicted in FIG. 1, it is understood that wireless system 100 may provide wireless broadband access to additional user equipment.

In this embodiment, wireless system 100 operates using frequency division duplexing (FDD), with two separate frequency bands, or channels, assigned for downlink (DL) and uplink (UL) communications. From the perspective of the BS 102, DL communications are transmitted signals, and UL communications are received signals. From the perspective of the UE 104, DL communications are received signals, and UL communications are transmitted signals. DL band 106 and UL band 108 are assigned with a guard band (GB) 110 between them to reduce interference between the DL band 106 and UL band 108 during operation. The guard band may be tens or hundreds of MHz. In spite of the guard band, there is still significant leakage of transmission power into the receive band, as transmission power at the point of transmission is significantly higher than reception power at the point of reception.

Figure 2:
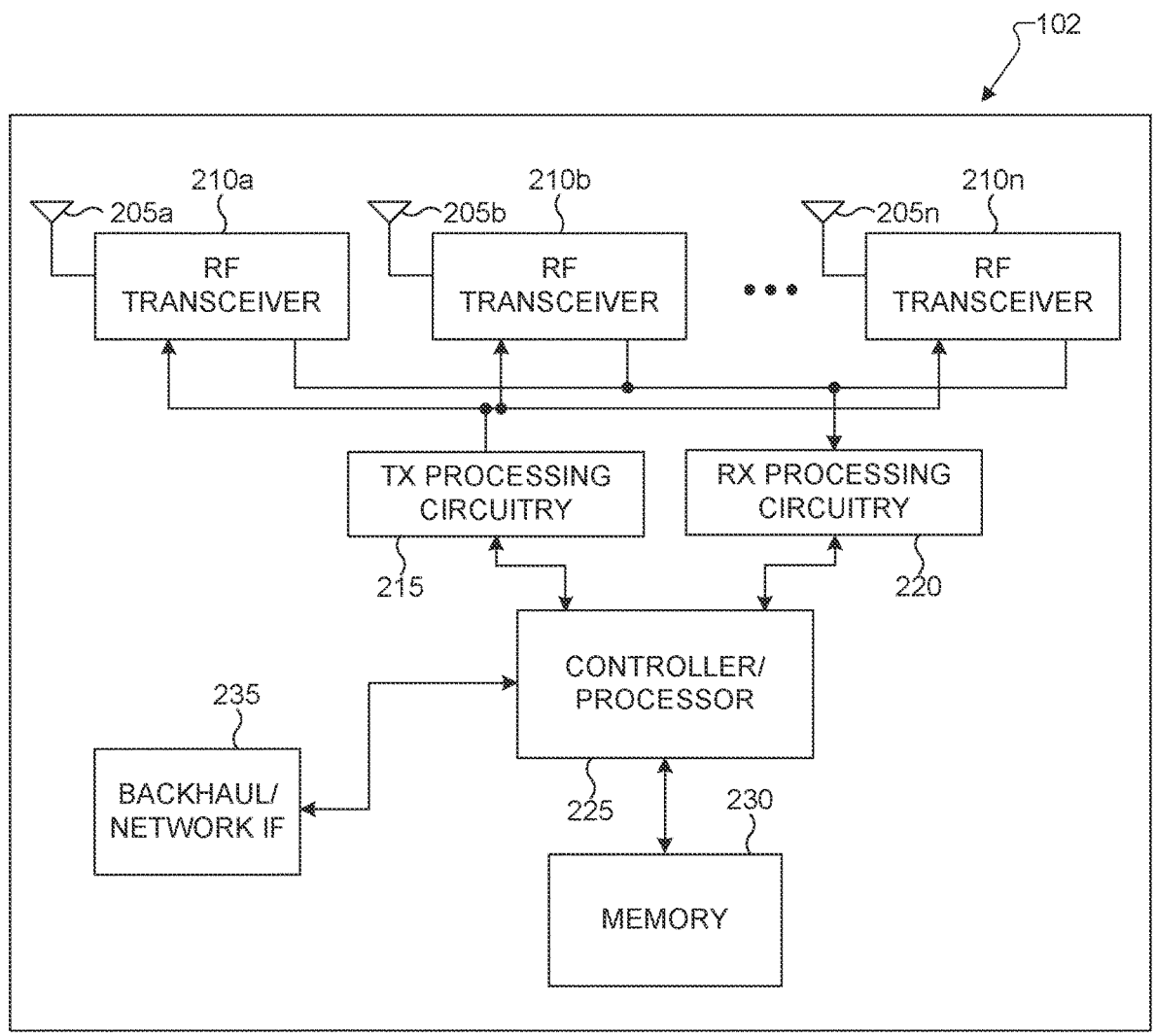
FIG. 2 illustrates an example BS according to embodiments of the present disclosure.

FIG. 2 illustrates an example BS 102 according to embodiments of the present disclosure. The embodiment of the BS 102 illustrated in FIG. 2 is for illustration only, and the BS 102 of FIG. 1 could have the same or similar configuration. However, BSs come in a wide variety of configurations, and FIG. 2 does not limit the scope of this disclosure to any particular implementation of a BS.

As shown in FIG. 2, the BS 102 includes multiple antennas 205*a*-205*n*, multiple RF transceivers 210*a*-210*n*, transmit (TX) processing circuitry 215, and receive (RX) processing circuitry 220. The BS 102 also includes a controller/processor 225, a memory 230, and a backhaul or network interface 235.

The RF transceivers 210*a*-210*n* receive, from the antennas 205*a*-205*n*, incoming RF signals, such as signals transmitted by UE 104 or other UEs in the wireless system 100. The RF transceivers 210*a*-210*n* down-convert the incoming RF signals to generate IF or baseband signals. The IF or baseband signals are sent to the RX processing circuitry 220, which generates processed baseband signals by filtering, decoding, and/or digitizing the baseband or IF signals. The RX processing circuitry 220 transmits the processed baseband signals to the controller/processor 225 for further processing.

The TX processing circuitry 215 receives analog or digital data (such as voice data, web data, e-mail, or interactive video game data) from the controller/processor 225. The TX processing circuitry 215 encodes, multiplexes, and/or digitizes the outgoing baseband data to generate processed baseband or IF signals. The RF transceivers 210*a*-210*n* receive the outgoing processed baseband or IF signals from the TX processing circuitry 215 and up-convert the baseband or IF signals to outgoing RF signals that are transmitted via the antennas 205*a*-205*n*.

The RF transceivers 210*a*-210*n* are FDD transceivers that facilitate simultaneous reception of the incoming RF signals and transmission of the outgoing RF signals. The RF transceivers 210*a*-210*n* can include duplexers that facilitate the simultaneous reception and transmission, as well as provide isolation between the incoming and outgoing RF signals. In some embodiments, the RF transceivers 210*a*-210*n* include active RF cancellation processes that operate in the analog domain to further isolate the incoming RF signals from the outgoing RF signals, as will be further described below. The RF transceivers 210*a*-210*n* may include circulators instead of duplexers when active RF cancellation processes are included. In other embodiments, the RX processing circuitry 220 includes this active RF cancellation process. The active RF cancellation process can be implemented using dedicated hardware, such as RF filters and analog FIR filters.

The controller/processor 225 can include one or more processors or other processing devices that control the overall operation of the BS 102. For example, the controller/processor 225 could control the reception of forward channel signals and the transmission of reverse channel signals by the RF transceivers 210*a*-210*n*, the RX processing circuitry 220, and the TX processing circuitry 215 in accordance with well-known principles. The controller/processor 225 could support additional functions as well, such as more advanced wireless communication functions.

For instance, the controller/processor 225 could support beam forming or directional routing operations in which outgoing signals from multiple antennas 205*a*-205*n* are weighted differently to effectively steer the outgoing signals in a desired direction. Any of a wide variety of other functions could be supported in the BS 102 by the controller/processor 225.

The controller/processor 225 could support a dynamic active RF cancellation process. For example, the controller/ processor 225 could use feedback from received signals, obtained from RX processing circuitry 220, to modify attributes of a FIR filter in the active RF cancellation process (e.g., to adjust attenuation, phase shift, or delay of taps of the FIR filter) to change the target frequency band on which the active RF cancellation process operates.

The controller/processor 225 is also capable of executing programs and other processes resident in the memory 230, such as an operating system (OS). The controller/processor 225 can move data into or out of the memory 230 as required by an executing process.

The controller/processor 225 is also coupled to the backhaul or network interface 235. The backhaul or network interface 235 allows the BS 102 to communicate with other devices or systems over a backhaul connection or over a network. The interface 235 could support communications over any suitable wired or wireless connection(s). For example, when the BS 102 is implemented as part of a cellular communication system (such as one supporting 5G, LTE, or LTE-A), the interface 235 could allow the BS 102 to communicate with other BSs over a wired or wireless backhaul connection. When the BS 102 is implemented as an access point, the interface 235 could allow the BS 102 to communicate over a wired or wireless local area network or over a wired or wireless connection to a larger network (such as the Internet). The interface 235 includes any suitable structure supporting communications over a wired or wireless connection, such as an Ethernet or RF transceiver.

The memory 230 is coupled to the controller/processor 225. Part of the memory 230 could include a random access memory (RAM), and another part of the memory 230 could include a Flash memory or other read-only memory (ROM).

Although FIG. 2 illustrates one example of BS 102, various changes may be made to FIG. 2. For example, the BS 102 could include any number of each component shown in FIG. 2. As a particular example, an access point could include a number of interfaces 235, and the controller/processor 225 could support routing functions to route data between different network addresses. As another particular example, while shown as including a single instance of TX processing circuitry 215 and a single instance of RX processing circuitry 220, the BS 102 could include multiple instances of each (such as one per RF transceiver). Also, various components in FIG. 2 could be combined, further subdivided, or omitted and additional components could be added according to particular needs.

Figure 3:
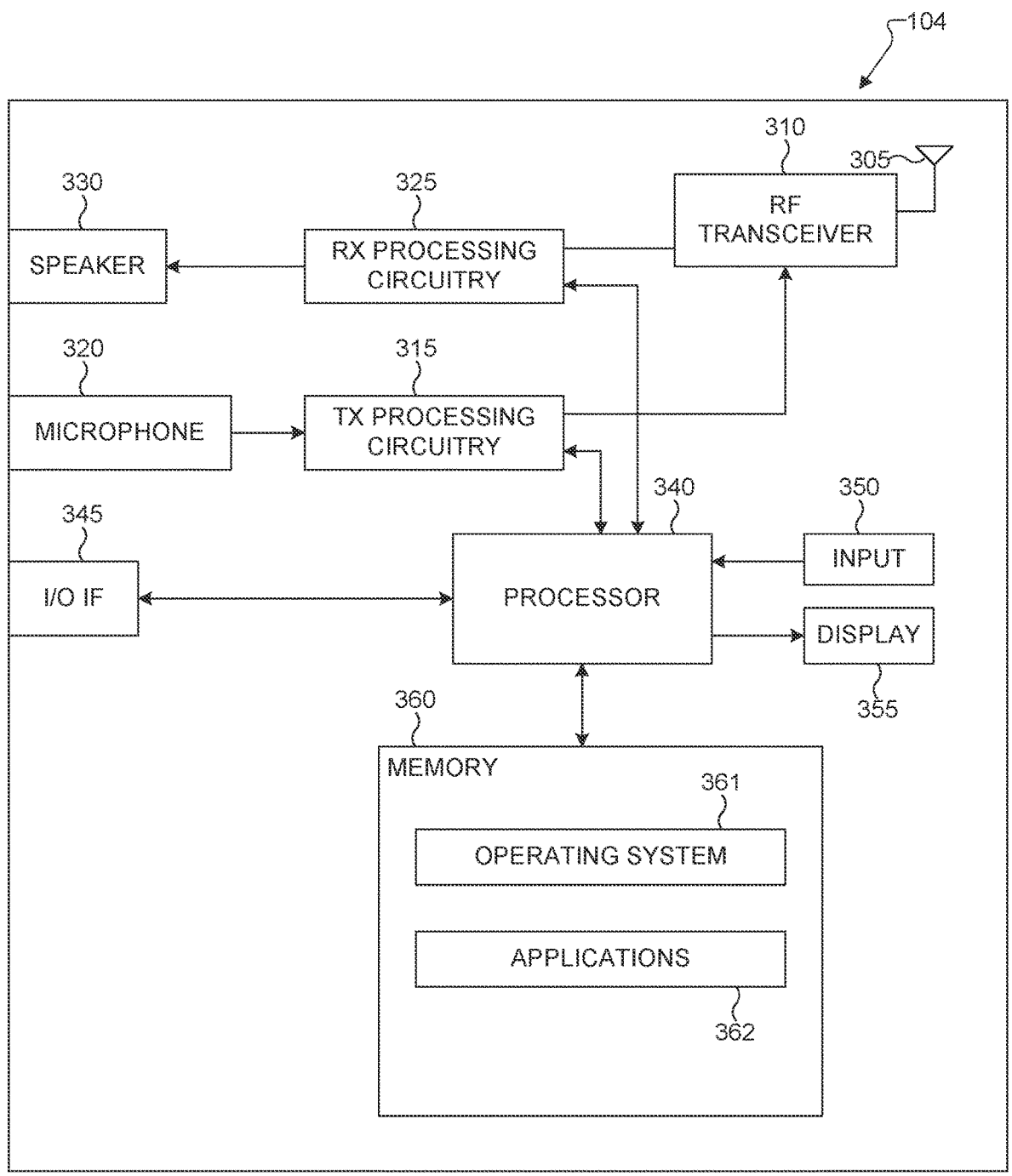
FIG. 3 illustrates an example UE according to embodiments of the present disclosure.

FIG. 3 illustrates an example UE 104 according to embodiments of the present disclosure. The embodiment of the UE 104 illustrated in FIG. 3 is for illustration only, and the UE 104 of FIG. 1 could have the same or similar configuration. UEs come in a wide variety of configurations, and FIG. 3 does not limit the scope of this disclosure to any particular implementation of a UE.

As shown in FIG. 3, the UE 104 includes an antenna 305, a radio frequency (RF) transceiver 310, TX processing circuitry 315, a microphone 320, and receive (RX) processing circuitry 325. The UE 104 also includes a speaker 330, a processor 340, an input/output interface (I/O IF) 345, a touchscreen 350, a display 355, and a memory 360. The memory 360 includes an OS 361 and one or more applications 362.

The RF transceiver 310 receives, from the antenna 305, an incoming RF signal transmitted by a BS, such as BS 102, of the wireless system 100. The RF transceiver 310 down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the processor 340 for further processing (such as for web browsing data).

The TX processing circuitry 315 receives analog or digital voice data from the microphone 320 or other outgoing baseband data (such as web data, e-mail, or interactive video game data) from the processor 340. The TX processing circuitry 315 encodes, multiplexes, and/or digitizes the outgoing baseband data to generate a processed baseband or IF signal. The RF transceiver 310 receives the outgoing processed baseband or IF signal from the TX processing circuitry 315 and up-converts the baseband or IF signal to an outgoing RF signal that is transmitted via the antenna 305.

The RF transceiver 310 is an FDD transceiver that facilitates simultaneous reception of the incoming RF signal and transmission of the outgoing RF signal. The RF transceiver 310 can include a duplexer that facilitates the simultaneous reception and transmission, and also provides isolation between the incoming and outgoing RF signals. In some embodiments, the RF transceiver 310 includes an active RF cancellation process that operates in the analog domain to further isolate the incoming RF signal from the outgoing RF signal, as will be further described below. The RF transceiver 310 may include a circulator instead of a duplexer when an active RF cancellation process is included. In other embodiments, the RX processing circuitry 325 includes this active RF cancellation process. The active RF cancellation process can be implemented using dedicated hardware, such as an RF filter and an analog FIR filter.

The processor 340 can include one or more processors or other processing devices and execute the OS 361 stored in the memory 360 in order to control the overall operation of the UE 104. For example, the processor 340 could control the reception of forward channel signals and the transmission of reverse channel signals by the RF transceiver 310, the RX processing circuitry 325, and the TX processing circuitry 315 in accordance with well-known principles. In some embodiments, the processor 340 includes at least one microprocessor or microcontroller.

The processor 340 is also capable of executing other processes and programs resident in the memory 360, such as processes for CSI feedback on uplink channel. The processor 340 can move data into or out of the memory 360 as required by an executing process. In some embodiments, the processor 340 is configured to execute the applications 362 based on the OS 361 or in response to signals received from BSs or an operator. The processor 340 is also coupled to the I/O interface 345, which provides the UE 104 with the ability to connect to other devices, such as laptop computers and handheld computers. The I/O interface 345 is the communication path between these accessories and the processor 340.

The processor 340 is also coupled to the touchscreen 350 and the display 355. The operator of the UE 104 can use the touchscreen 350 to enter data into the UE 104. The display 355 may be a liquid crystal display, light emitting diode display, or other display capable of rendering text and/or at least limited graphics, such as from web sites.

The processor 340 could support a dynamic active RF cancellation process. For example, the processor 340 could use feedback from received signals, obtained from RX processing circuitry 325, to modify attributes of a FIR filter in the active RF cancellation process (e.g., to adjust attenuation, phase shift, or delay of taps of the FIR filter) to change the target frequency band on which the active RF cancellation process operates.

The memory 360 is coupled to the processor 340. Part of the memory 360 could include a RAM, and another part of the memory 360 could include a Flash memory or other ROM.

Although FIG. 3 illustrates one example of UE 104, various changes may be made to FIG. 3. For example, various components in FIG. 3 could be combined, further subdivided, or omitted and additional components could be added according to particular needs. As a particular example, the processor 340 could be divided into multiple processors, such as one or more central processing units (CPUs) and one or more graphics processing units (GPUs). Also, while FIG. 3 illustrates the UE 104 configured as a mobile telephone or smartphone, UEs could be configured to operate as other types of mobile or stationary devices.

Figure 4:
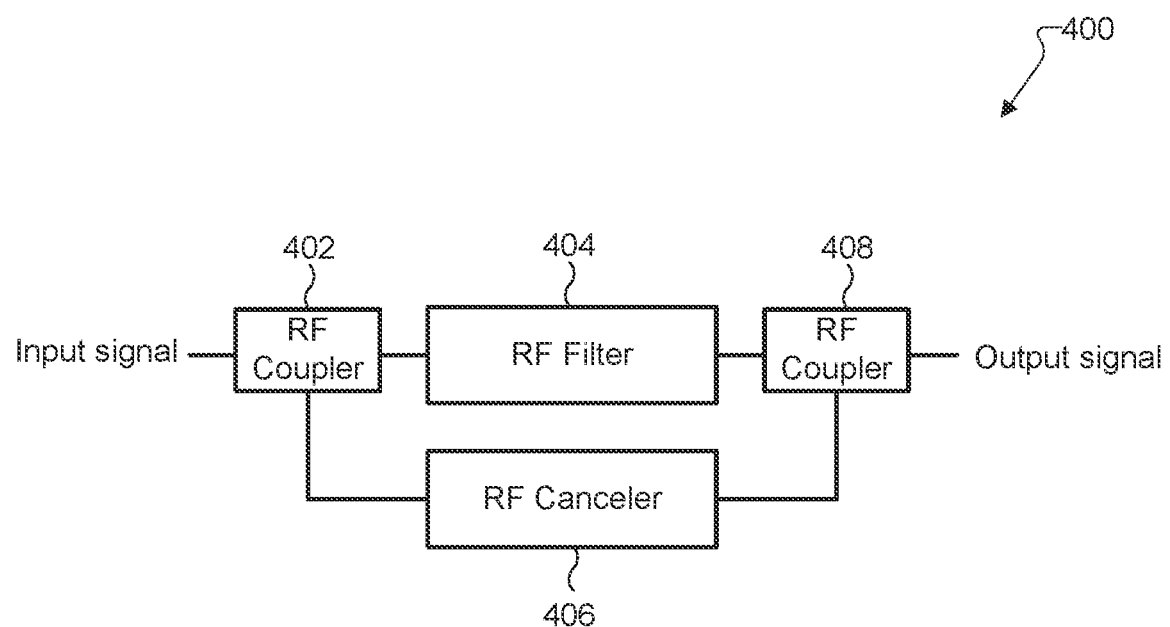
FIG. 4 illustrates a block diagram of an example active RF cancellation process according to embodiments of the present disclosure.

FIG. 4 illustrates a block diagram of an example active RF cancellation process 400 according to embodiments of the present disclosure. For convenience, the active RF cancellation process 400 is discussed below as being implemented in an FDD BS, however it is understood that the active RF cancellation process 400 could be implemented in a FDD UE. In some embodiments, the active RF cancellation process 400 could be implemented in a BS 102 or UE 104 of FIGS. 1-3. For convenience, the active RF cancellation process 400 is discussed below as being implemented on one of the TX side or the RX side of the FDD BS, however it is understood that it can implemented both on the TX side and on the RX side in the same FDD BS.

The active RF cancellation process 400 includes a first RF coupler 402, an RF filter 404, an RF canceler 406, and a second RF coupler 408. The RF coupler 402 couples a sample of the input signal to the RF canceler 406, and passes the remainder of the input signal to the RF filter 404. In some embodiments, the sample of the input signal can be less than 1% of the total power of the input signal.

The RF filter 404 is a bandpass filter and can be, for example, a cavity filter. The RF filter 404 provides wideband isolation outside of its passband. In the TX side of an FDD BS, the passband can be the TX band. In the RX side of an FDD BS, the passband can be the RX band.

The RF canceler 406 provides additional isolation within a target frequency band. Whether the active RF cancellation process 400 is implemented on the TX side or the RX side, the target band of the RF canceler 406 is selected to cancel TX leakage within the RX band. If implemented on the TX side, this has minimal impact on the signal within the passband of the RF filter 404 (i.e., within the TX band). If implemented on the RX side, the RF canceler 406 is designed to have minimal impact on the desired RX signal within the RX band. The RF canceler 406 can be, for example, an FIR filter. The amplitude and phase shift of each tap of the FIR filter can be adjusted to set the target band of the RF canceler 406.

The RF canceler 406 operates on the RF input signal to generate a cancellation signal that has matched amplitude and inverted phase with respect to the output signal of the RF filter 404 within the target band of the RF canceler 406. As the target band coincides with the location of the TX leakage, the cancellation signal output by RF canceler 406 is a signal with matched amplitude and inverted phase as compared to the TX leakage component of the output of the RF filter 404. The operations of the RF canceler 406 are further described below with respect to FIG. 5.

The cancellation signal is coupled with the output of the RF filter 404 by RF coupler 408. This sums the cancellation signal with the output of the RF filter 404 to generate the output signal of the active RF cancellation process 400. The output signal of the RF cancellation process 400 has enhanced TX-RX isolation and improved frequency response within the target band of the RF canceler 406, as compared to the output of the RF filter 404. The output signal of the active RF cancellation process 400 also has an improved transition from the passband to the stopband of the RF filter 404. On the TX side, the output signal of the active RF cancellation process 400 is ideally the TX signal within the TX band, and the signal components in the RX band are below a defined noise floor (e.g. the RX noise floor referred to a low noise amplifier (LNA) input in the RX chain). On the RX side, the output signal of the active RF cancellation process 400 is ideally the RX signal within the RX band, with TX leakage eliminated. The canceller reduces the TX leakage signal in the desired TX band to save the LNA from a large input signal that may desensitize it.

The amount of cancellation offered by the RF canceler 406 in the target band improves SINR dB to dB, such that 20 dB of cancellation provided by the RF canceler 406 improves the SINR roughly 10 dB. The active RF cancellation process 400 is designed to degrade the SINR due to TX-RX isolation by no more than 0.1 dB as compared to the RX input referred noise floor when the TX is turned off. Accordingly, the RF canceler 406 is designed such that the out-of-band TX leakage within the RX band is 10 dB below the RX noise floor. Without the RF canceler 406, a larger RF filter 404 with 20 dB higher attenuation is needed to achieve the same SINR, significantly reducing throughput.

Although FIG. 4 illustrates one example of active RF cancellation process 400, various changes may be made to FIG. 4. For example, various components in FIG. 4 could be combined, further subdivided, or omitted and additional components could be added according to particular needs.

Figure 5:
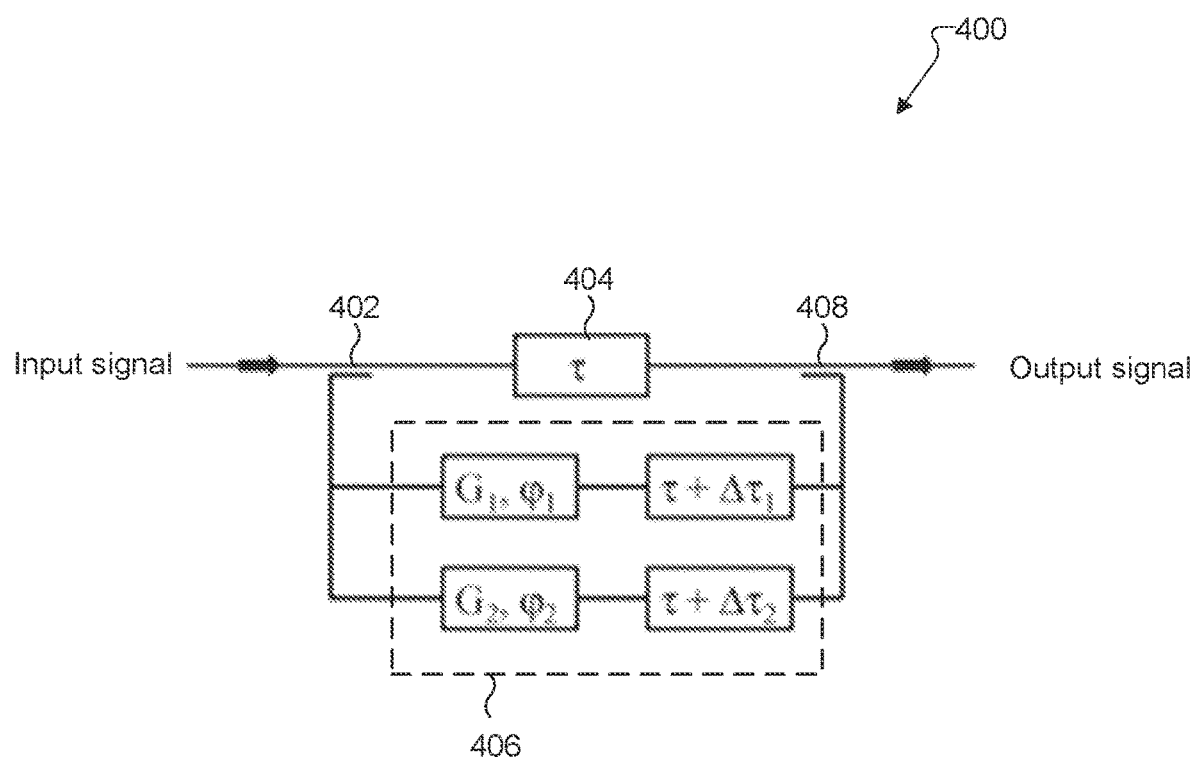
FIG. 5 illustrates a block diagram of an example RF cancellation process with additional detail of an example RF canceler according to embodiments of the present disclosure.

FIG. 5 illustrates a block diagram of an example RF cancellation process 400 with additional detail of an example RF canceler 406 according to embodiments of the present disclosure. For convenience, the active RF cancellation process 400 is discussed below as being implemented in an FDD BS, however it is understood that the active RF cancellation process 400 could be implemented in a FDD UE. In some embodiments, the active RF cancellation process 400 could be implemented in a BS 102 or UE 104 of FIGS. 1-3.

In this embodiment, the RF filter 404 is represented as a delay line having a group delay of $\tau$. The RF canceler 406 is a two tap FIR filter (i.e., having a number of taps n=2), and the cancellation signal is the sum of the outputs of each tap. Each tap n has an attenuation $G_n$, a phase shift $\varphi_n$, and a delay $\tau + \Delta\tau_n$, such that the group delay $\tau$ of the RF filter 404 is matched in the FIR filter. In some embodiments, $\tau$ is small (e.g., on the order of 2-3 ns), allowing the RF filter 404 and the RF canceler 406 to be implemented in an RF integrated circuit (RFIC). For this example, the active RF cancellation process 400 is represented in exponential form by the equation:

$$V_{OUT} = V_{IN} \cdot \begin{pmatrix} e^{j\omega_A \tau} + G_1 e^{j\varphi_1} e^{j\omega_A(\tau+\Delta\tau_1)} + & G_2 e^{j\varphi_2} e^{j\omega_A(\tau+\Delta\tau_2)} \\ e^{j\omega_B \tau} + G_1 e^{j\varphi_1} e^{j\omega_B(\tau+\Delta\tau_1)} + & G_2 e^{j\varphi_2} e^{j\omega_B(\tau+\Delta\tau_2)} \end{pmatrix} \quad (1)$$

Where $V_{OUT}$ is the output signal, $V_{IN}$ is the input signal, and $\omega_A$ and $\omega_B$ are the edge frequencies of the target band (i.e., the target band for cancellation is the band between frequencies $\omega_A$ and $\omega_B$). To achieve the desired cancellation target band, the FIR filter of RF canceler 406 is designed such that the filter has nulls at frequencies $\omega_A$ and $\omega_B$. Specifically, the attenuation values $G_1$ and $G_2$ and phase shift values $\varphi_1$ and $\varphi_2$ are selected such that the FIR filter has nulls at frequencies $\omega_A$ and $\omega_B$. In matrix form, this is represented by selecting values that satisfy the following equation, where $z_1=G_1 e^{j\varphi_1}$ and $z_2=G_2 e^{j\varphi_2}$:

$$\begin{bmatrix} e^{j\omega_A \tau} & e^{j\omega_A(\tau+\Delta\tau_1)} & e^{j\omega_A(\tau+\Delta\tau_2)} \\ e^{j\omega_B \tau} & e^{j\omega_B(\tau+\Delta\tau_1)} & e^{j\omega_B(\tau+\Delta\tau_2)} \end{bmatrix} \begin{bmatrix} 1 \\ z_1 \\ z_2 \end{bmatrix} = \begin{bmatrix} 0 \\ 0 \end{bmatrix} \quad (2)$$

The solution to equation (2) is the nullspace of the matrix:

$$\begin{bmatrix} e^{j\omega_A \tau} & e^{j\omega_A(\tau+\Delta\tau_1)} & e^{j\omega_A(\tau+\Delta\tau_2)} \\ e^{j\omega_B \tau} & e^{j\omega_B(\tau+\Delta\tau_1)} & e^{j\omega_B(\tau+\Delta\tau_2)} \end{bmatrix} \quad (3)$$

Accordingly, the attenuation values $G_1$ and $G_2$ and phase shift values $\varphi_1$ and $\varphi_2$ are selected from this nullspace. In this way, the attenuation and phase shift parameters of the RF canceler 406 can be selected for a desired cancellation target band that is bounded by frequencies $\omega_A$ and $\omega_B$. As the values of $\omega_A$ and $\omega_B$ are brought closer together (i.e., as the bandwidth of the target band is reduced), the amount of attenuation within the target band increases.

Although FIG. 5 illustrates one example of RF canceler 406, various changes may be made to FIG. 5. For example, various components in FIG. 5 could be combined, further subdivided, or omitted and additional components could be added according to particular needs. As a specific example, the FIR filter could be a multi-tap filter having any number of taps.

Figure 6:
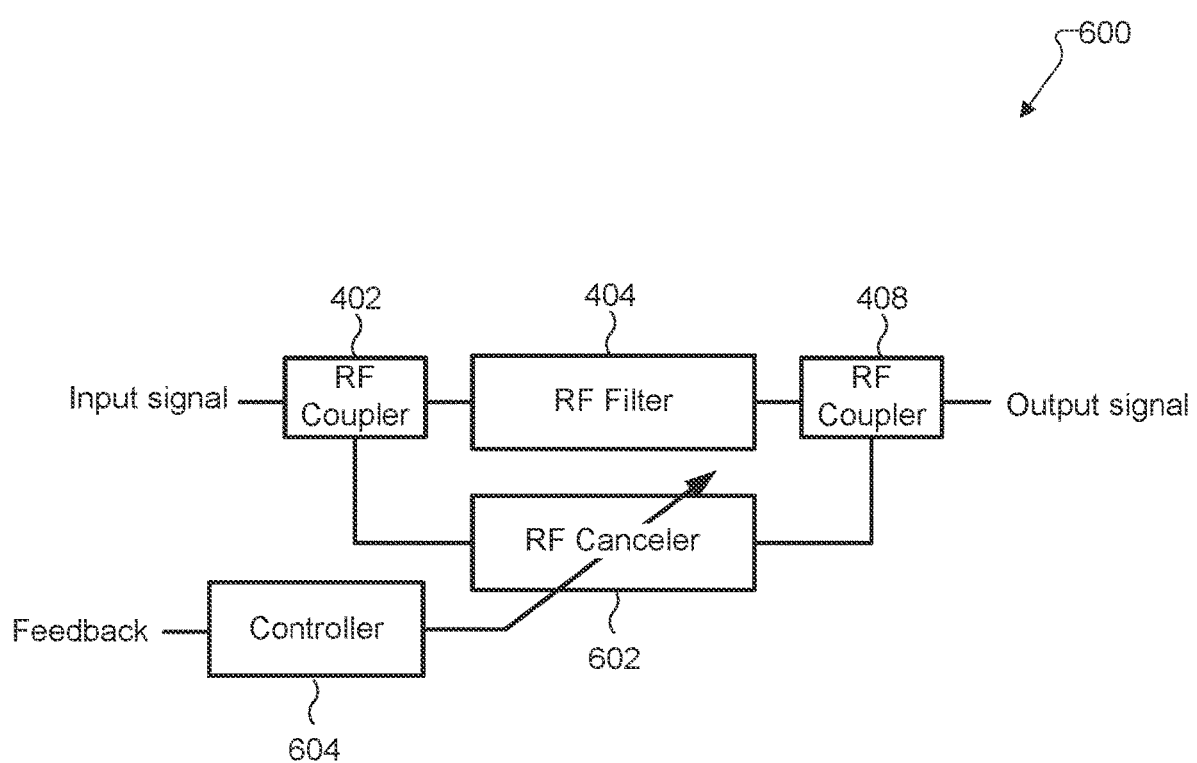
FIG. 6 illustrates a block diagram of an example tunable active RF cancellation process according to embodiments of the present disclosure.

FIG. 6 illustrates a block diagram of an example tunable active RF cancellation process 600 according to embodiments of the present disclosure. For convenience, the tunable active RF cancellation process 600 is discussed below as being implemented in an FDD BS, however it is understood that the tunable active RF cancellation process 600 could be implemented in a FDD UE. In some embodiments, the tunable active RF cancellation process 600 could be implemented in a BS 102 or UE 104 of FIGS. 1-3. For convenience, the tunable active RF cancellation process 600 is discussed below as being implemented on one of the TX side or the RX side of the FDD BS, however it is understood that it can implemented both on the TX side and on the RX side in the same FDD BS.

The tunable active RF cancellation process 600 is similar to the active RF cancellation process 400, and can include the first RF coupler 402, the RF filter 404, and the second RF coupler 408 of active RF cancellation process 400. The RF canceler 602 is tunable in situ by a controller 604. In some embodiments, the controller 604 can be a controller such as controller/processor 225 or processor 340. In other embodiments, the controller 604 can be a dedicated controller for the tunable active RF cancellation process 600.

The tunable active RF cancellation process 600 also operates similarly to the active RF cancellation process 400 insofar as the RF coupler 402 couples a sample of the input signal to the RF canceler 602, and the RF canceler 602 is an FIR filter that operates on the sample of the input signal to generate a cancellation signal within a target band, which is then combined with the output of the RF filter 404 by the second RF coupler 408.

However, the operation of the RF canceler 602 can be modified by the controller 604 in situ in order to adjust the target band of the RF canceler 602. In some embodiments, the controller 604 makes these adjustments based on feedback information on a target signal. For example, the target signal can be the RX signal in an FDD BS. Based on the power level of the target RX signal, the controller 604 can determine whether the cancellation of TX leakage within the RX band was sufficiently canceled. If not, the controller can determine an updated target frequency band for the RF canceler to reduce the power of the TX leakage signal further.

In some embodiments, this involves determining a new $\omega_A$ and $\omega_B$ of the target band and searching for attenuation and phase shift values of the FIR filter of RF canceler 602 for which $\omega_A$ and $\omega_B$ are nulls, as described above with respect to FIG. 5. Once these updated values have been found, the controller 604 can modify the operation of the RF canceler 602 by setting the FIR filter to use the updated attenuation and phase shift values. In some embodiments, this update process can be performed periodically.

When the tunable active RF cancellation process 600 is used on the RX side of an FDD BS (i.e., when it is placed in the RX chain of the FDD BS), the controller 604 can receive feedback from the RX chain that includes the canceled out-of-band TX leakage signal as well as the desired RX signal in the RX band. For example, the tunable active RF cancellation process 600 can be located prior to an LNA in the RX chain, and the output of the LNA can be used as feedback. The controller 604 can estimate residual power of the out-of-band TX leakage in the RX band by, for example, measuring the power of the TX leakage signal in the baseband. The controller 604 can adjust the parameters of the FIR filter as described above to minimize this residual power.

When the tunable active RF cancellation process 600 is used on the TX side of an FDD BS (i.e., when it is placed in the TX chain of the FDD BS), the controller 604 can receive feedback from the main RX signal path or from an auxiliary RX signal path. This feedback can include the canceled out-of-band TX leakage signal as well as the desired RX signal in the RX band. The controller 604 can estimate residual power of the out-of-band TX leakage in the RX band and adjust the parameters as described above to minimize this residual power.

In some embodiments, the signal-to-interference-plus-noise (SINR) of the RX signal is a metric that can be used to determine whether cancellation is satisfactory. The amount of cancellation offered by the RF canceler 602 in the target band improves SINR dB to dB, such that 20 dB of cancellation provided by the RF canceler 602 improves the SINR roughly 10 dB. The tunable active RF cancellation process 600 is designed to degrade the SINR due to TX-RX isolation by no more than, e.g., 0.1 dB (an acceptable degradation of RX sensitivity). Accordingly, the controller 604 can determine to update the parameters of the FIR filter in the RF canceler 602 such that the out-of-band TX leakage within the RX band is, e.g., 10 dB below the RX noise floor.

Although FIG. 6 illustrates one example of tunable active RF cancellation process 600, various changes may be made to FIG. 6. For example, various components in FIG. 6 could be combined, further subdivided, or omitted and additional components could be added according to particular needs. The values for sensitivity degradation are determined by system analysis for a particular application in consideration of the required cancellation by RF canceler (SIC) in order to provide a needed isolation between the UL and DL bands.

Figure 7:
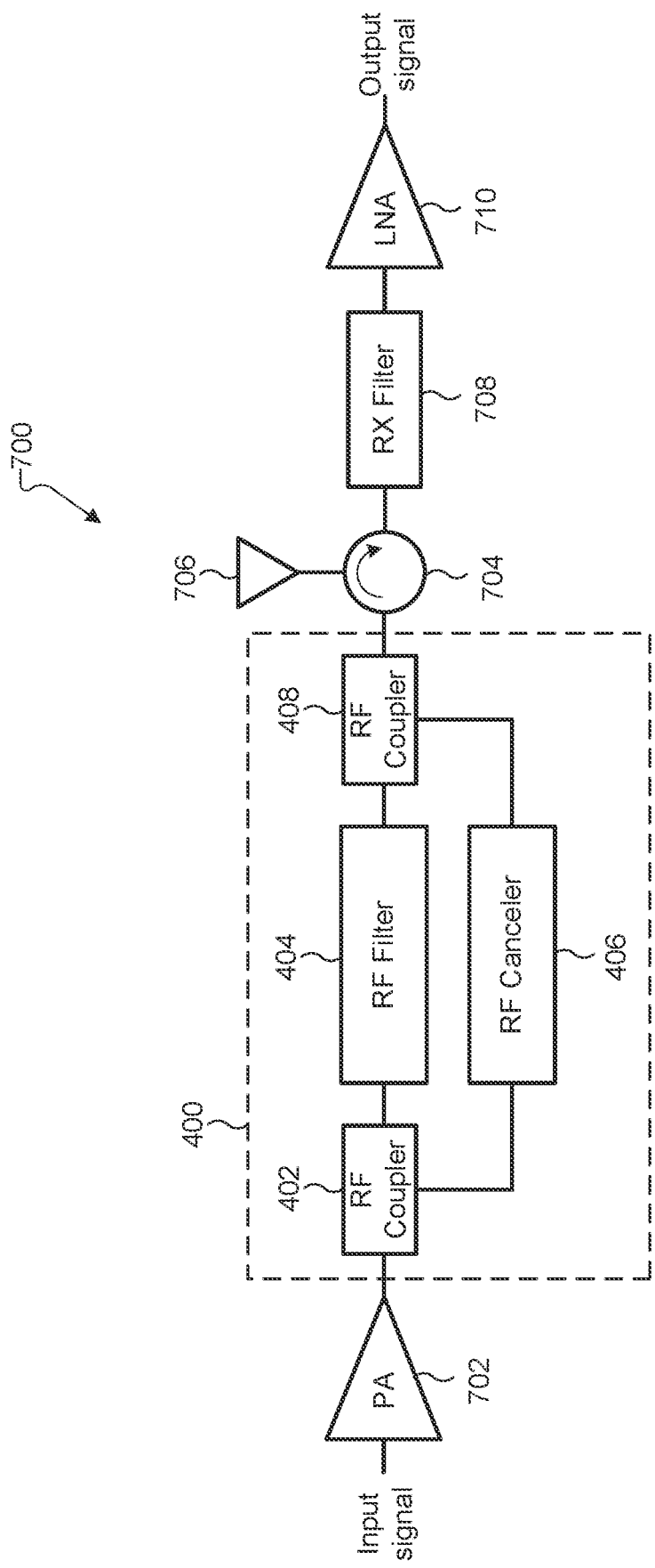
FIG. 7 illustrates a block diagram of an example FDD communication entity according to embodiments of the present disclosure.

FIG. 7 illustrates a block diagram of an example FDD communication entity 700 according to embodiments of the present disclosure. For convenience, the FDD communication entity 700 is discussed below as being implemented in a FDD BS, however it is understood that the communication entity 700 could be implemented in a FDD UE. In some embodiments, the FDD communication entity 700 could be implemented in a BS 102 or UE 104 of FIGS. 1-3. It is understood that any number of communication entities 700 could be included in one device, such as one BS 102 or UE 104. In some embodiments, multiple communication entities 700 can be used in a MIMO or massive MIMO antenna array.

The FDD communication entity 700 includes a power amplifier (PA) 702, an active RF cancellation process 400, a circulator 704, an antenna 706, an RX filter 708, and an LNA 710. Although the FDD communication entity 700 uses an active RF cancellation process 400, it is understood that the tunable active RF cancellation process 600 could be used with the FDD communication entity 700. In some embodiments, the circulator 704 could be replaced with a standard duplexer for further isolation.

An input signal from a TX chain is amplified by PA 702 and input to the active RF cancellation process 400. The active RF cancellation process 400 operates as described above with respect to FIG. 4 to cancel out-of-band TX leakage in the RX band. The output of the active RF cancellation process 400 is sent to the circulator 704 for output through the antenna 706 (e.g., to a UE 104). The circulator 704 isolates changing antenna impedance of the antenna 706 from the output of the active RF cancellation process 400.

The antenna 706 simultaneously receives an RX signal that is passed through the circulator 704 and through an RX filter 708 to the RX chain, which includes the LNA 710. The RX filter 708, in conjunction with the active RF cancellation process 400 and the circulator 704, replaces the standard duplexer used in FDD systems. The output of the LNA 710 can be sent for further RX processing. In embodiments using the tunable active RF cancellation process 600, the output of the LNA 710 can be coupled back to the controller 604 for use as feedback to modify operation of the RF canceler 602 to further improve cancellation performance of the tunable active RF cancellation process 600.

Although FIG. 7 illustrates one example of FDD communication entity 700, various changes may be made to FIG. 7. For example, various components in FIG. 7 could be combined, further subdivided, or omitted and additional components could be added according to particular needs. As an example, the RF canceler can be located on the RX side of the FDD communication entity 700, in place of the RX filter. In such an alternative embodiment, the output of the RF canceler 406 could be coupled through coupler 408 to the output of the RX filter 708. That is, coupler 408 could be placed at the output of the LNA 710, and the output of RF canceler 406 would be fed to the output of LNA 710.

Figure 8:
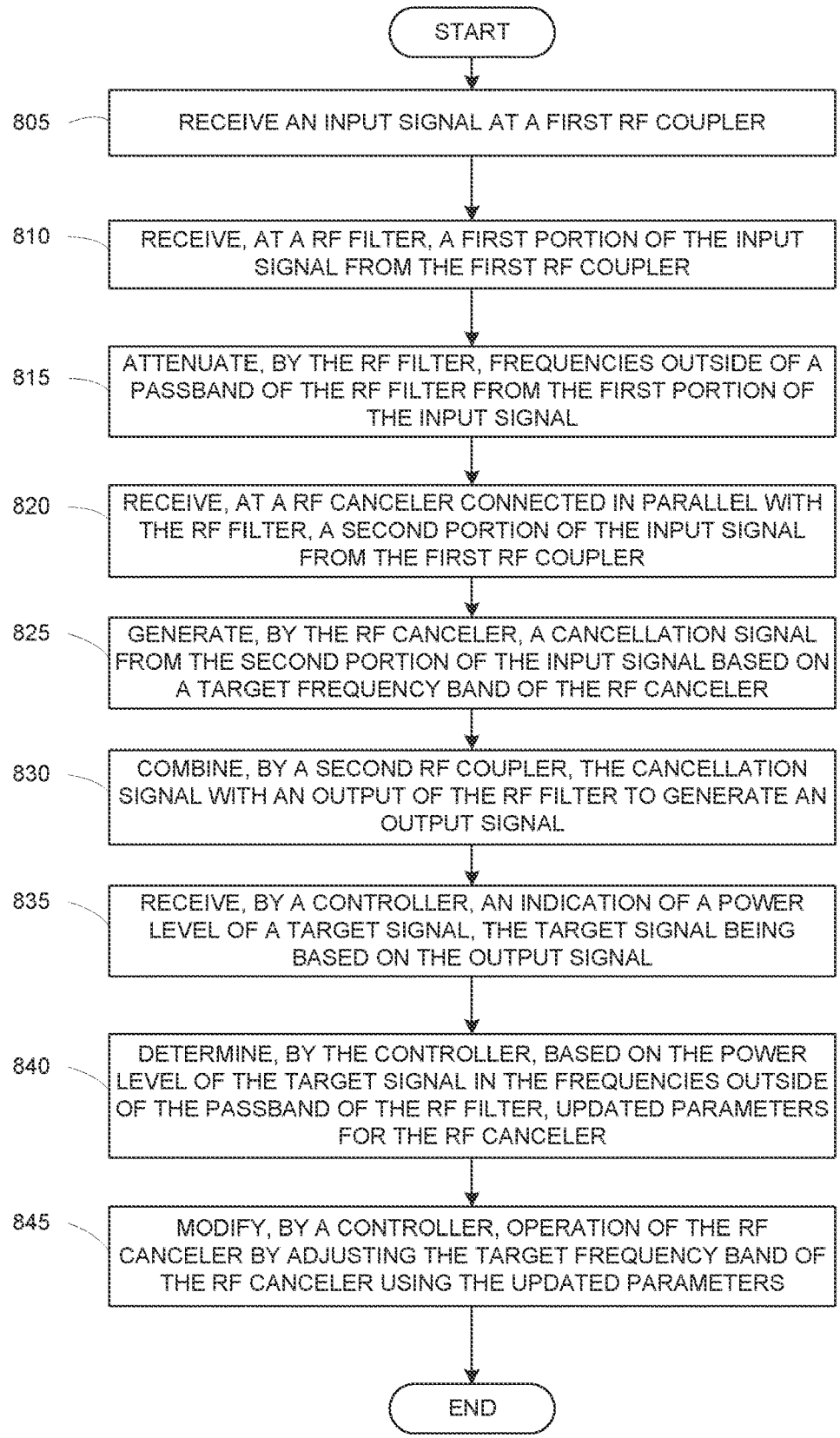
FIG. 8 illustrates a process for RF isolation using active RF cancellation according to embodiments of the present disclosure.

FIG. 8 illustrates a process for RF isolation using active RF cancellation according to embodiments of the present disclosure. For convenience, the RF isolation process is discussed below as being implemented in an FDD BS, however it is understood that the RF isolation process could be implemented in a FDD UE. The RF isolation process may be performed by a BS 102 or UE 104 of FIGS. 1-3, using the active RF cancellation process 400 of FIG. 4 or the tunable active RF cancellation process 600 of FIG. 6.

The process begins by receiving an input signal at a first RF coupler (step 805). For example, the RF coupler may receive a signal from a PA in a TX chain of a FDD transceiver, or from an antenna (or an isolation element such as a circulator or duplexer) in the RX chain of a FDD transceiver. For convenience, the process will be further described below with respect to the TX side of the FDD transceiver but it is understood that the process could be used in the RX side of the FDD transceiver.

Next, an RF filter receives a first portion of the input signal from the first RF coupler (step 810). For example, the first RF coupler may pass 99% of the power of the input signal to the RF filter at step 810.

The RF filter then attenuates frequencies outside of a passband of the RF filter from the first portion of the input signal (step 815). For example, the RF filter may be a cavity filter with a passband designed to correspond to the TX band of the FDD transceiver. At step 815, the RF filter rejects frequencies outside of the TX band from the signal in order to reduce out-of-band interference, such as TX leakage into the RX band of the FDD transceiver.

Next, an RF canceler that is connected in parallel with the RF filter receives a second portion of the input signal from the first RF coupler (step 820). For example, the first RF coupler may pass 1% of the power of the input signal to the RF canceler at step 820.

The RF canceler then generates a cancellation signal from the second portion of the input signal based on a target frequency band of the RF canceler (step 825). For example, the RF canceler at step 825 matches the amplitude of the second portion of the input signal within the target frequency band with the amplitude of the output signal from the RF filter, and inverts the phase of the second portion of the input signal within the target frequency band. The target frequency band of the RF canceler can be outside of the passband of the RF filter (e.g., in the RX band).

The RF coupler combines the cancellation signal with the output of the RF filter to generate an output signal (step 830). Frequencies within the target frequency band of the RF canceler are further attenuated from the output of the RF filter by the combination of the cancellation signal with the output of the RF filter at step 830.

In some embodiments, the RF canceler is an analog finite impulse response (FIR) filter having one or more taps, and the cancellation signal is a sum of outputs of each tap of the one or more taps. In turn, the output signal is a sum of the cancellation signal with the output of the RF filter. Each tap of the FIR filter has parameters including gain/attenuation, phase shift, and delay. These parameters determine the location of the target frequency band of the RF canceler. The operation of the RF canceler in such embodiments is described above with respect to FIG. 5.

In embodiments using the active RF cancellation process 400 of FIG. 4, the process may end after step 830. In embodiments using the tunable active RF cancellation process 600 of FIG. 6, the process continues to step 835.

A controller receives an indication of a power level of a target signal, the target signal being based on the output signal (step 835). For example, in an FDD transceiver, the target signal is the RX signal, and the controller receives an indication of the power level of the RX signal, such as a SINR measurement of the RX signal, at step 835.

Next, the controller determines, based on the power level of the target signal in the frequencies outside of the passband of the RF filter, updated parameters for the RF canceler (step 840). For example, when the RF canceler is an analog FIR filter, the controller determines at least one of an updated attenuation or an updated phase shift for at least one tap of the one or more taps of the analog FIR filter at step 840. This determination may be based, for example, on the considerations discussed above with respect to FIG. 5 for selecting parameters of the FIR filter taps in order to minimize the power of the TX leakage signal in the RX band. When the indication of the power level of the target signal is the SINR of the RX signal in the RX band, the controller could determine the parameters of the FIR filter such that the power of the TX leakage signal is 10 dB below the RX noise floor in the RX band.

The controller then modifies operation of the RF canceler by adjusting the target frequency band of the RF canceler using the updated parameters determined at step 840 (step 845). When the RF canceler is an analog FIR filter, step 845 includes setting the analog FIR filter to use the at least one of the updated attenuation or the updated phase shift for the at least one tap of the one or more taps of the FIR filter.

In some embodiments, steps 835-845 may be repeated periodically. For example, these steps could be repeated for every signal transmission or reception to maintain optimal TX-RX isolation for optimal RX signal quality. Alternatively, these steps could be repeated after a predetermined time interval, or after a predetermined number of transmissions, as a trade off between the computational demand of these steps and the benefit of maintaining optimal TX-RX isolation.

The above flowcharts illustrate example methods that can be implemented in accordance with the principles of the present disclosure and various changes could be made to the methods illustrated in the flowcharts herein. For example, while shown as a series of steps, various steps in each figure could overlap, occur in parallel, occur in a different order, or occur multiple times. In another example, steps may be omitted or replaced by other steps. As a specific example, steps 810-825 can occur substantially in parallel, with a particular timing relationship described above with respect to FIG. 5.

Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claims scope. The scope of patented subject matter is defined by the claims.

What is claimed is:

1. A radio frequency (RF) unit comprising:
a first RF coupler configured to receive an input signal;
an RF filter configured to receive a first portion of the input signal from the first RF coupler and attenuate frequencies outside of a passband of the RF filter from the first portion of the input signal;
an RF canceler connected in parallel with the RF filter, the RF canceler configured to:
  receive a second portion of the input signal from the first RF coupler; and
  generate a cancellation signal from the second portion of the input signal based on a target frequency band of the RF canceler such that:
    the cancellation signal has an amplitude within the target frequency band that corresponds to an amplitude of an output of the RF filter within the target frequency band, and
    the cancellation signal has a phase that is inverted from a phase of the output of the RF filter; and
a second RF coupler configured to combine the cancellation signal with an output of the RF filter to generate an output signal.

2. The RF unit of claim 1, wherein:
the target frequency band of the RF canceler is outside of the passband of the RF filter, and
frequencies within the target frequency band of the RF canceler are further attenuated from the output of the RF filter by the combination of the cancellation signal with the output of the RF filter.

3. The RF unit of claim 1, further comprising a controller configured to modify operation of the RF canceler by adjusting the target frequency band of the RF canceler.

4. The RF unit of claim 1, wherein:
the RF canceler is an analog finite impulse response (FIR) filter having one or more taps, and
the cancellation signal is a sum of outputs of each tap of the one or more taps.

5. The RF unit of claim 4 further comprising a controller configured to modify operation of the RF canceler by changing at least one of an attenuation or a phase shift of at least one tap of the one or more taps of the analog FIR filter.

6. The RF unit of claim 4, further comprising a controller configured to:
receive an indication of a power level of a target signal, the target signal being based on the output signal;
determine, based on the power level of the target signal in the frequencies outside of the passband of the RF filter, at least one of an updated attenuation or an updated phase shift for at least one tap of the one or more taps of the analog FIR filter; and
modify operation of the RF canceler by setting the analog FIR filter to use the at least one of the updated attenuation or the updated phase shift for the at least one tap of the one or more taps.

7. A method for radio frequency (RF) isolation comprising:
receiving, at a first RF coupler, an input signal;
receiving, at an RF filter, a first portion of the input signal from the first RF coupler;
attenuating, by the RF filter, frequencies outside of a passband of the RF filter from the first portion of the input signal;
receiving, at an RF canceler connected in parallel with the RF filter, a second portion of the input signal from the first RF coupler;
generating, by the RF canceler, a cancellation signal from the second portion of the input signal based on a target frequency band of the RF canceler such that:
  the cancellation signal has an amplitude within the target frequency band that corresponds to an amplitude of an output of the RF filter within the target frequency band, and
  the cancellation signal has a phase that is inverted from a phase of the output of the RF filter; and
combining, by a second RF coupler, the cancellation signal with an output of the RF filter to generate an output signal.

8. The method of claim 7, wherein:
the target frequency band of the RF canceler is outside of the passband of the RF filter, and
frequencies within the target frequency band of the RF canceler are further attenuated from the output of the RF filter by the combination of the cancellation signal with the output of the RF filter.

9. The method of claim 7, further comprising modifying, by a controller, operation of the RF canceler by adjusting the target frequency band of the RF canceler.

10. The method of claim 7, wherein:
the RF canceler is an analog finite impulse response (FIR) filter having one or more taps, and
the cancellation signal is a sum of outputs of each tap of the one or more taps.

11. The method of claim 10, further comprising modifying, by a controller, operation of the RF canceler by changing at least one of an attenuation or a phase shift of at least one tap of the one or more taps of the analog FIR filter.

12. The method of claim 10, further comprising:
receiving, by a controller, an indication of a power level of a target signal, the target signal being based on the output signal;
determining, by the controller, based on the power level of the target signal in the frequencies outside of the passband of the RF filter, at least one of an updated attenuation or an updated phase shift for at least one tap of the one or more taps of the analog FIR filter; and
modifying, by the controller, operation of the RF canceler by setting the analog FIR filter to use the at least one of the updated attenuation or the updated phase shift for the at least one tap of the one or more taps.

13. A communication entity comprising:
at least one antenna configured to transmit and receive signals; and
at least one radio frequency (RF) unit operably connected to the at least one antenna and configured to cancel interference in at least one of the signals received or to be transmitted, the RF unit comprising:
a first RF coupler configured to receive an input signal comprising the signal received or the signal to be transmitted;
an RF filter configured to receive a first portion of the input signal from the first RF coupler and attenuate frequencies outside of a passband of the RF filter from the first portion of the input signal;
an RF canceler connected in parallel with the RF filter, the RF canceler configured to:
receive a second portion of the input signal from the first RF coupler, and
generate a cancellation signal from the second portion of the input signal based on a target frequency band of the RF canceler such that:
the cancellation signal has an amplitude within the target frequency band that corresponds to an amplitude of an output of the RF filter within the target frequency band, and
the cancellation signal has a phase that is inverted from a phase of the output of the RF filter; and
a second RF coupler configured to combine the cancellation signal with an output of the RF filter to generate an output signal.

14. The communication entity of claim 13, wherein:
the target frequency band of the RF canceler is outside of the passband of the RF filter, and
frequencies within the target frequency band of the RF canceler are further attenuated from the output of the RF filter by the combination of the cancellation signal with the output of the RF filter.

15. The communication entity of claim 13, further comprising a controller configured to modify operation of the RF canceler by adjusting the target frequency band of the RF canceler.

16. The communication entity of claim 13, wherein:
the RF canceler is an analog finite impulse response (FIR) filter having one or more taps, and
the cancellation signal is a sum of outputs of each tap of the one or more taps.

17. The communication entity of claim 16, further comprising a controller configured to:
receive an indication of a power level of a target signal, the target signal being based on the output signal;
determine, based on the power level of the target signal in the frequencies outside of the passband of the RF filter, at least one of an updated attenuation or an updated phase shift for at least one tap of the one or more taps of the analog FIR filter; and
modify operation of the RF canceler by setting the analog FIR filter to use the at least one of the updated attenuation or the updated phase shift for the at least one tap of the one or more taps.

* * * * *